United States Patent

[11] 3,611,071

[72] Inventor Benjamin Agusta
Burlington, Vt.
[21] Appl. No. 814,980
[22] Filed Apr. 10, 1969
[45] Patented Oct. 5, 1971
[73] Assignee International Business Machines Corporation
Armonk, N.Y.

[54] INVERSION PREVENTION SYSTEM FOR SEMICONDUCTOR DEVICES
3 Claims, 4 Drawing Figs.

[52] U.S. Cl. .......... 317/235 R, 317/235 (21.1), 317/235 (22.2), 317/235 (46.5), 317/235 (46.1)
[51] Int. Cl. .......... H01l 19/00, H01c 7/14
[50] Field of Search .......... 319/235 (21.1), 235 (22.2), 235 (46.1), 235 (46)

[56] References Cited

UNITED STATES PATENTS

| | | | |
|---|---|---|---|
| 3,436,612 | 4/1969 | Grosvalet | 317/235 |
| 3,454,844 | 7/1969 | Dill | 317/235 |
| 3,470,609 | 10/1969 | Breitweiser | 317/235 |
| 3,473,032 | 10/1969 | Lehovec | 317/235 |

*Primary Examiner*—Jerry D. Craig
*Attorney*—Sughrue, Rothwell, Mion, Zinn & Macpeak

ABSTRACT: A passivated coated semiconductor device in which a phosphosilicate layer, included to retard inversion in P-type areas or enhancement in N-type areas of the device, is supplemented by a negatively charged electrode to prevent inherent but undesirable positive mobile charges accumulated during fabrication or originated by an overlying encapsulating layer from passing through the phosphosilicate layer and reaching the P-type areas, where they could cause inversion.

PATENTED OCT 5 1971 3,611,071

SHEET 1 OF 2

INVENTOR

BENJAMIN AGUSTA

BY Sughrue, Rothwell, Mion, Zinn & Macpeak

ATTORNEYS

INVERSION PREVENTION SYSTEM FOR SEMICONDUCTOR DEVICES

BACKGROUND OF THE INVENTION

1. Field of the Invention

This invention pertains to integrated or monolithic circuits and other semiconductor devices, and more particularly, to semiconductor devices that are further encapsulated with a covering layer of dielectric, including means for preventing inversion.

2. Description of the Prior Art

Excessive leakage current is a problem in the manufacture of large scale integrated circuits, and particularly in paralleling the bit lines of a large number of monolithic memory devices as described, for example, in Ser. No. 539,210, now U.S. Pat. No. 3,508,209 assigned to the same assignee as the present invention. Typically, in integrated circuits, a pattern of conductive metal interconnection lands that are extended over the oxide coated surface of the monolithic chip, are covered by a layer of dielectric, that is, glass. Hence the interconnecting metal lies in the interface region between a layer of thermal oxide material and a layer of encapsulating or insulating glass. Holes are etched through the glass to allow electrical connection between various lands and the package terminals. Then the entire device is further encapsulated by enclosure in a can, plastic or like, to make a completed packaged component.

It has been found experimentally that the processing materials and encapsulating materials, especially glasses containing alkali metal impurities such as sodium, etc., migrate down through the passivation and contaminate the semiconductor. These impurities act as mobile positive charge centers that invert the relatively low doped semiconductor (P-type) areas in the monolithic chip to opposite (N-type) areas, thereby appreciably increasing the leakage current of the device per the description in U.S. Pat. No. 3,335,340 (Barson et al.). Further, in N-type areas, the change centers tend to increase or enhance the conductivity of the areas.

It is known that by forming a top surface of phosphosilicate material over the layer of thermal oxide material prior to the interconnect metallization, the mobile charges can be trapped at the thermal oxide and phosphosilicate interface. This initially prevents severe degradation of the junctions. With subsequent normal processing there is a problem in assuring that sufficient phosphosilicate remains to protect the device both during and after fabrication. This problem is magnified by the randomness of the type and quantity of mobile charge centers to be protected against.

In U.S. Pat. No. 3,363,152 (Lin) it was suggested to place a conductive layer over the passivating layer of a single transistor and to apply a negative potential thereto to prevent inversion. However, the Lin patent did not consider the problem of preventing inversion in circuits which are already partially protected with a phosphosilicate layer nor circuits that have an encapsulating and/or insulating layer above the interconnect metallization.

SUMMARY OF THE INVENTION

This invention may be summarized as a system in which a negatively charged electrode is used in an integrated circuit or other semiconductor device to attract mobile positive charges, to supplement a phosphosilicate layer. The system can also be used to manufacture field-effect transistors (FET). With FET devices, the surface conductivity is an intrinsic part of the device performance, hence this invention can be used to "isolate" or prevent leakage between devices as well as to trap positive ion metal impurities.

By placing a metallic conductive or trapping electrode over the passivating layer and by connecting the electrode to a negative potential, the electrode will attract and trap the mobile positive charge centers. As long as the electrode is supplied with a negative potential, the positive charge centers cannot reach the surface of the semiconductor material to thereby cause inversion. The effect of the electrode in producing capacitance from junctions to ground can be reduced somewhat by connecting the electrode to the negative potential source through a high resistance connection element, such as a resistor. While providing a high impedance path to ground for AC signals, the resistor would allow compensation for capacitive effects due to the interaction between the trapping electrode and device metallurgy. The trapping electrode may then be covered by or deposited on the encapsulating material, typically glass, nitride, or the like.

The charge trapping electrode prevents mobile charges from moving through the phosphosilicate layer to the P-type areas of the surface of the semiconductor material. Thus, the phosphosilicate layer and the trapping electrode work in conjunction to prevent inversion in the P-type areas or enhancement of N-type areas.

DESCRIPTION OF THE PREFERRED EMBODIMENT

Figure 1:
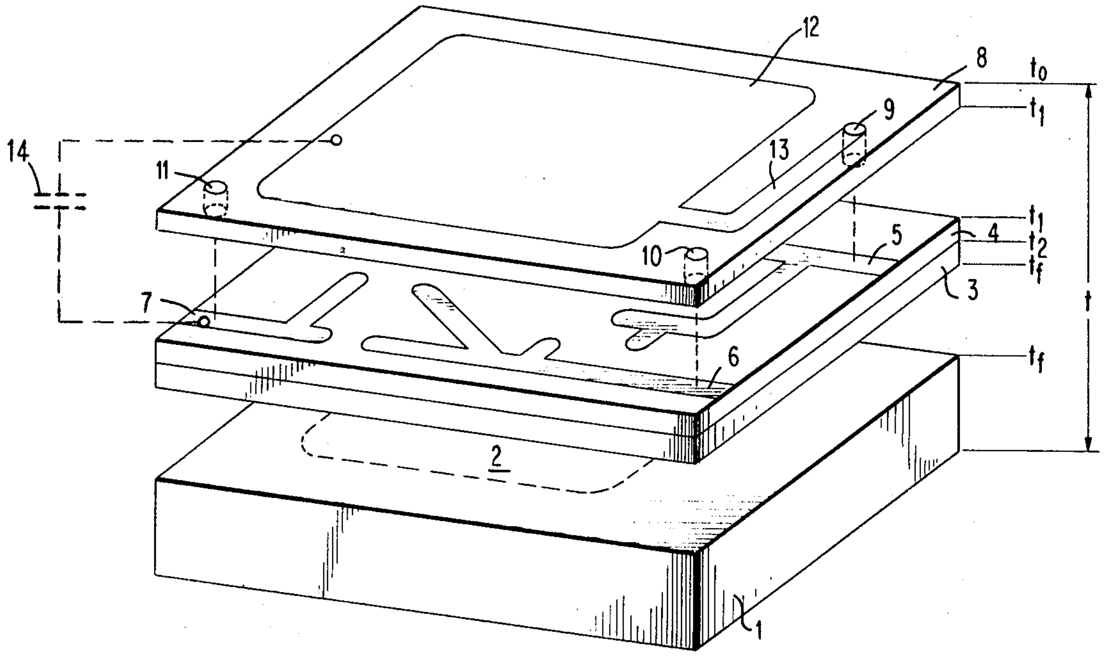
FIG. 1 is an isometric view of a semiconductor device including the trapping electrode of the present invention.

In FIG. 1, a layer 1 of semiconductor material includes an area 2 containing conventional monolithic circuits including many junctions between regions of different conductivity types. Although such devices are frequently made with many devices in adjacent areas of a semiconductor wafer, for ease of explanation, only a single device, or chip, is illustrated here. Immediately above and adjacent to semiconductor layer 1 is a layer 3 of insulation, typically thermal oxide material, having a layer 4 of phosphosilicate material bound thereto.

The formation of such phosphosilicate layers is explained more completely in U.S. Pat. No. 3,343,049 (Miller et al.). The phosphosilicate layer is typically a mixture of the thermal oxide and phosphorus pentoxide. Therefore, a layers 3 and 4 can be considered together as a thermal oxide layer including phosphosilicate.

On layer 4 are a number of metallic lands or conductive means 5, 6 and 7 of the type conventionally used in the manufacture of integrated circuits. These lands are supported on layers 3 and 4 and connected (not shown) to the semiconductor 2 in a conventional manner, according to the circuit to be constructed.

Immediately above and adjacent to layer 4 and the lands is a layer 8 disposed for encapsulation and/or insulation of the semiconductor and metallization material, typically glass or silicon nitride. The glass layer may be formed by the method described in U.s. Pat. No. 3,247,428 (Perri et al.). A number of external contact pads or terminal means 9, 10 and 11 are adapted to receive operating potentials and to supply these potentials through layer 8 respective to lands 5, 6 and 7 by conventional photolithography and etch techniques. Additional layers (not shown), similar to layer 3, may be disposed on the layer 8 and include conductive members for connection to circuit members 5, 6 and 7 by appropriate means (not shown). In this arrangement, layer 8 serves as insulation between the conductive members. Accordingly, the trapping plate is not restricted to a single level of passivation and encapsulation.

In this instance, assume that the circuit is designed so that contact pad 9 receives a negative potential, preferably the most negative potential connected to the device. However, a separate negative potential supply may be employed. A conductive electrode 12 is placed on the upper surface of 8 connected to pad 9 via lead 13 and extends over all or a portion of the area 2 in layer 1. Alternatively, lead 13 may be a resistor of high resistance value. The resistor may be diffused in semiconductor 1 and suitably connected to the electrode 12. The resistor helps reduce the parasitic capacitance between the electrode 12 and the lands 5, 6 and 7. The negatively charged trapping electrode then attracts the mobile positive charges up to the metal electrode 12 from within the encapsulation layer 8. In addition, the trapping electrode can supplement the phosphosilicate layer 4 by also attracting mobile impurities from within the thermal layer 3, particularly where the layer 4 may be limited in thickness and/or doping concentration due to device design considerations. Thus, the mobile charges do not reach the P-type areas in the junction area 2, and inversion is prevented.

The electrode 12 must have a thickness great enough to serve as an equipotential surface. In the preferred embodiment, it is approximately 5,000 to 7,000 A. thick. A thinner electrode layer 12 would have less tendency to short through defects in the encapsulation layer 8. The shape of the electrode 12 may take any form and is not necessarily that shown in FIG. 1. The location of the electrode 12 is only required over over those regions that are susceptible to inversion or enhancement. Plural trapping electrodes may also be employed in various levels of a multilevel interconnection structure due to device design layout restraints.

The terminals 9, 10 and 11 would normally be formed by a metal deposition and etch process after conventional via holes through the encapsulation layer 8 are fabricated. The electrode 12 can be applied during the same interval as the terminal metal. For example, if a chromium-copper-gold electrode is preferred for the terminal metal it could also serve as the electrode metal, otherwise molybdenum or aluminum deposition can be used to produce the electrode. The simultaneous formation of trapping electrode and terminal metal simplifies the fabrication process chosen.

Figure 2:
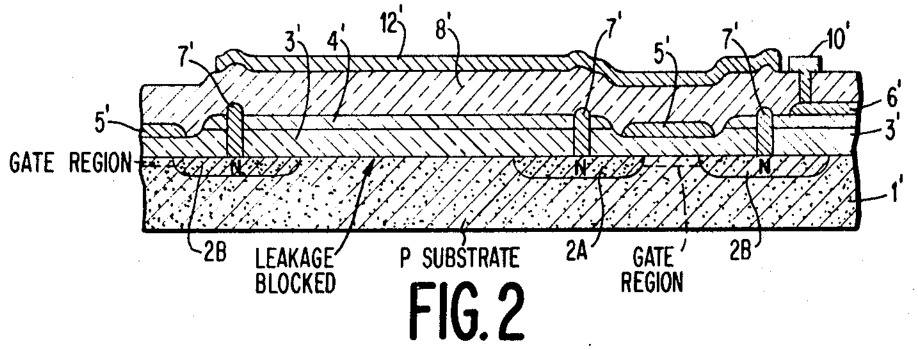
FIG. 2 is a cross-sectional view of an FET device including the electrode of the present invention for trapping and/or device isolating.

FIG. 2 shows an FET device including a P-type substrate 1′ an N-type area 2A and B, the latter functioning as source and drain regions, respectively. Layer 3′ represents passivation layers including an active gate oxide region, gate metallurgy and suitable passivation for interconnection metallurgy. One method of fabricating the device shown in FIG. 2 is described in Ser. No. 468,481, filed June 30, 1965, now U.S. Pat. No. 3,445,924 and assigned to the same assignee as the present invention. An encapsulation layer 8′, typically glass, nitride or the like, covers the passivation and interconnect metal. A trapping electrode 12′ is formed on the encapsulation layer, as described in FIG. 1, and attracts the mobile positive charges in the layer 8′ as well as supplementing the effect of the phosphosilicate layer 4′. Suitable passage ways are formed in the layer 8′ to permit suitable power supplies to be connected to device circuit metallurgy. The negative supply for trapping electrode 12′ may be a separate supply as described in connection with FIG. 1. In the absence of electrode 12′ there would tend to be a leakage or inversion path between adjacent elements. The trapping electrode attracts the positive charges for reasons previously indicated and thereby isolation of the FET devices in a single substrate is effected.

Figure 3:
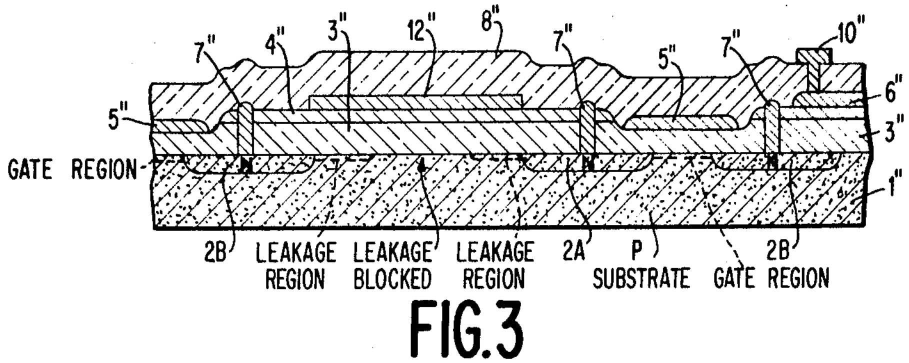
FIG. 3 is another embodiment of FIG. 2 showing the electrode for device isolation purposes.

An alternate FET structure is shown in FIG. 3 wherein the trapping electrode 12″ is deposed on the passivation layers 3″4″ and covered by encapsulation layer 8″. The trapping electrode may cover all or a portion of the interval between source and drain electrodes. A negative potential may be supplied to the electrode by appropriate means (not shown) as suggested in FIGS. 1 and 2. In FIG. 3, the trapping electrode pulls down mobile charges from the overlying layer 8″ whereas in FIG. 2 the trapping layer pulls up charges from the underlying layer 8′.

An added feature of this invention is a pre-use stress step that is introduced as part of the fabrication process; namely, it is a simultaneous application of heat and voltage for a period of time to allow collection of impurities. This step comprises the heating of the device to 100° C.–300° C. The very high temperature provides thermal energy to accelerate the mobility of ionic contaminants in the structure. Simultaneous application of voltage to the trapping electrode of order of 10 V., results in the impurity ions being attracted to the trapping electrode. Generally, the device is allowed to cool before the voltage is reduced. Temperatures and voltages are applied for a period of time to remove the ionic contaminants from reaching the surface area of the semiconductor device. This period may be of the order of one to two hours. The temperature, voltage and time depend upon the total ionic contaminant level in the structure. The process step improves the yields of devices wherein excessive ionic impurity concentrations exist which otherwise would have an adverse affect on the semiconductor surface and performance. A related application, Ser. No. 378,062, now U.S. Pat. No. 3,303,059, assigned to the same assignee as the present invention, describes other details relative to this process.

Figure 4:
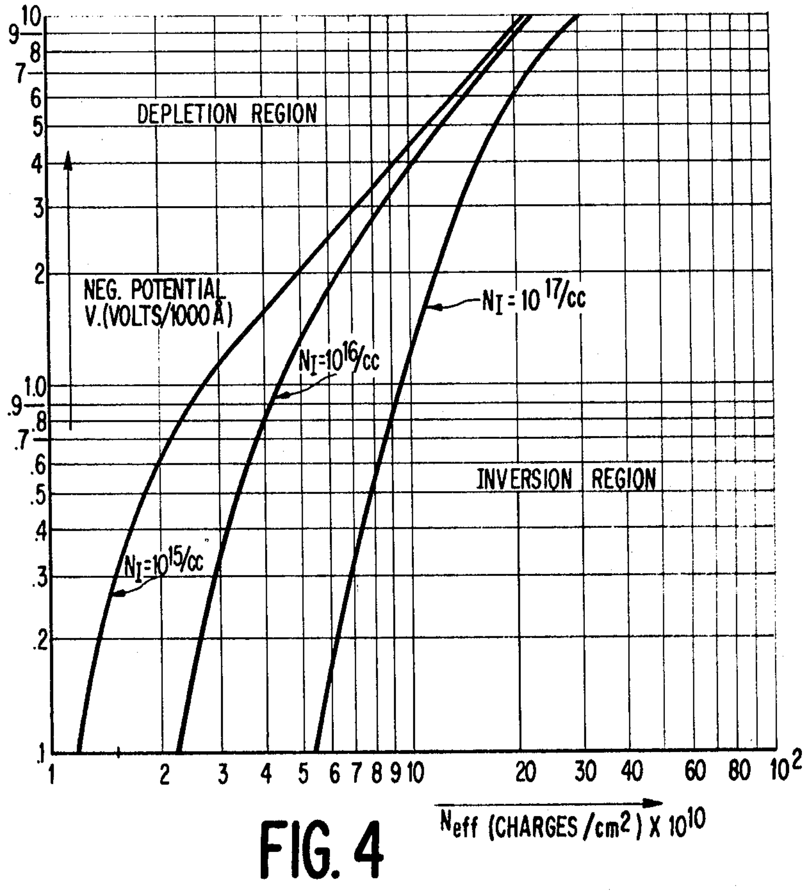
FIG. 4 is a log-log plot of trapping plate potential normalized to 1000 angstroms of silicon dioxide thickness to prevent inversion for various bulk impurity concentrations per cubic centimeter.

FIG. 4 considers the mechanism of the charge accumulation in the encapsulating layer 8, phosphosilicate layer 4, passivating layer 3, and semiconductor 1 as that of a metal-oxide semiconductor capacitance. The number of oxide induced charges in the semiconductor 1 from layers 8, 4 and 3 is shown as the abscissa in FIG. 4, and is computed by the following equation (1):

$$N_{ox}=-N_{eff}=-\int_{t_0=0}^{t_1}\frac{x}{qt_f}\eta(x)dx-\int_{t_1}^{t_2}\frac{x}{qt_f}\xi(x)dx-\int_{t_2}^{t_f}\frac{x}{qt_f}\zeta(x)dx \quad (1)$$

where:

$N_{ox}$ = Total number of ions per square centimeter in the various oxide layers 3, 4 and 8 in FIG. 1

$N_{eff}$ = Effective number of induced ionic charges per square centimeter in the silicon layer 1 of FIG. 1

$q$ = Unit amount of charge measured in coulombs $x$ = Thickness of dielectric measured toward silicon layer 1 of FIG. 1 from trapping potential plate (layer 12 of FIG. 1) with units of cm.

$t_o$ = Measurement at top surface of layer 8 in FIG. 1 with units of cm.

$t_1$ = Measurement at interface between bottom surface of layer 8 and top surface of layer 4 in FIG. 1 with units of cm.

$t_2$ = Measurement at interface between bottom surface layer 4 and top surface of layer 3 of FIG. 1 with units of cm.

$t_f$ = Measurement at interface between bottom surface of layer 4 and top surface of layer 1 in FIG. 1 with units of cm.

$\eta$ = Ionic charge distribution in $SiO_2$ layer 8 of FIG. 1, with units in coulomb/cm.$^3$ $\xi$ = Ionic charge distribution in PSG layer 4 of FIG. 1 with units in coulomb/cm.$^3$ $\zeta$ = Charge distribution in thermal $SiO_2$ layer 3 of FIG. 1 with units in coulomb/cm.$^3$ Both layers 8 and 3 contain contaminants, e.g. sodium, lead, lithium and potassium, and like protons that are positive in nature. The layer 4 aids in trapping and gettering these ions as described in U.S. Pat. No. 3,335,340, supra. The layer 8, however, due to its contamination, counters the effect of layer 4. The application of a negative potential to a trapping electrode 12 supplements the mechanism of layer 4. The trapping potential, shown as the ordinant in FIG. 4, is computed by the equation (2):

$$V=-(q/\epsilon)(N_s-N_{eff}) \quad (2)$$

where:

$V$ = The potential per unit thickness of dielectric that is applied to the metal trapping electrode layer 12 of FIG. 1 and is in units of volts/cm.

$q$ = A unit amount of charge in coulombs $N_s$ = The surface area charge density which is the number of charges per square centimeter that are needed to just invert the surface of semiconductor layer 1 of FIG. 1 with a bulk doping concentration of $N_I$ $N_{eff}$ = The number of image charges per square centimeter that is given by equation (b 1)

$\epsilon$ = Dielectric constant in farads/cm.

In equation (2) $N_s$ is defined by equation (3):

$$N_s = \sqrt{2\epsilon\ K\ T\ N_I\ q^{11}\ \ln\ (N_I/n_i)} \qquad (3)$$

where:

$N_s$ = Number of substrate surface charge units per square centimeter $q$ = Unit amount of charge in coulombs $\epsilon$ = Dielectric constant in farads/cm.

$K$ = Boltzman constant in electron volts/°K. (Kelvin)

$T$ = Absolute temperature in °K.(Kelvin)

$N_I$ = Bulk impurity concentration of the semiconductor substrate in units of impurity per cubic centimeter $n_i$ = Intrinsic carrier concentration in number per cubic centimeter FIG. 4 shows that for $N_{eff}$ of 1.5 × 10/cm.$^2$, a P substrate having a bulk impurity concentration of $10^{15}$ atoms per cubic centimeter requires 0.3 r. per 1,000 A. on the trapping electrode 12 to prevent inversion. State another way, for example, a 20,000 A. thickness is layers 3, 4 and 8, requires a negative potential of 6 v. to be applied as a minimum to prevent inversion in semiconductor 1. It has been found that as semiconductor ambient temperatures increase, smaller charge quantities in the layers 3 and 8 will invert the semiconductor 1. Accordingly, the trapping potential is further increased negatively to prevent inversion. However, the higher temperatures tend to increase ion mobility. Thus, the ions developed in the layers 3 and 8 are attracted to the trapping electrode in a shorter time period than that for ions trapped at lower temperatures.

While the invention has been particularly shown and described with references to a preferred embodiment thereof, it will be understood by those skilled in the art that various changes in form and details may be made therein without departing from the spirit and scope of the invention.

What is claimed is:

1. In an integrated circuit device having a layer of semiconductor material including a plurality of junctions between regions of different types of conductivity; a layer of thermal oxide material situated adjacent to said layer of semiconductor material, said thermal oxide material having an inherent tendency to carry mobile charges which cause undesirable inversion effects if they reach the layer of semiconductor material; conductive means on said layer of thermal oxide material for supplying operating potential, including a negative potential, to said layer of semiconductor material for energizing said integrated circuit device; a covering layer of an insulator of said semiconductor material covering said conductive means; and thermal means to provide to said conductive means said operating potential, including said negative potential, the improvement comprising;

a. a conductive electrode on said covering layer and extending over said plurality of junctions, and b. connecting means for electrically connecting said conductive electrode to said terminal means for supplying said negative potential to said conductive electrode, said connecting means including resistance means for reducing the parasitic capacitance between said conductive electrode and said conductive means on said layer of thermal oxide material, whereby said conductive electrode attracts said mobile charges to a part of said integrated circuit device remote from the layer of semiconductor material, thereby avoiding inversion.

2. A device according to claim 1 wherein said thermal oxide material includes a phosphosilicate and wherein said semiconductor material comprises silicon.

3. A device according to claim 1 further comprising: removable means for applying heat of a magnitude sufficient to heat said device to a temperature between 100° C. and 300° C., simultaneously with the application of a potential to said conductive electrode for a period of time sufficient to remove ionic contaminants from the surface of said semiconductor material.